(12) United States Patent
Kumatani

(10) Patent No.: US 6,577,016 B2
(45) Date of Patent: Jun. 10, 2003

(54) SEMICONDUCTOR DEVICE HAVING ADHESIVE INFLOW PREVENTING MEANS

(75) Inventor: Yoshiro Kumatani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/119,810

(22) Filed: Apr. 11, 2002

(65) Prior Publication Data

US 2002/0149119 A1 Oct. 17, 2002

(30) Foreign Application Priority Data

Apr. 11, 2001 (JP) .................................. 2001-112346

(51) Int. Cl.⁷ .............................................. H01L 23/48
(52) U.S. Cl. ...................................... 257/784; 257/723
(58) Field of Search ................................ 257/784, 723

(56) References Cited

U.S. PATENT DOCUMENTS 5,519,576 A * 5/1996 Moore ......................... 361/723
6,084,311 A * 7/2000 Jiang et al. ................... 257/782
6,204,454 B1 * 3/2001 Gotoh et al. .................. 174/255

FOREIGN PATENT DOCUMENTS

JP 7-245420 A 9/1995

\* cited by examiner

*Primary Examiner*—David Nelms
*Assistant Examiner*—Tu-Tu Ho
(74) *Attorney, Agent, or Firm*—Birch, Stewart, Kolasch & Birch, LLP

(57) ABSTRACT

A semiconductor device includes a print wiring board having a element mounting section, a wire connecting section and a wiring section for connecting the element mounting section with the wire connecting section, all of which are provided at least one by one on a same surface of the printing wiring board, wherein a semiconductor element is fixed to be mounted on the element mounting section with an adhesive, and is wire-bonded to the wire connecting section, and the wiring section is provided with inflow preventing means for preventing the adhesive or a component contained in the adhesive from flowing into the wire connecting section via the wiring section.

6 Claims, 4 Drawing Sheets

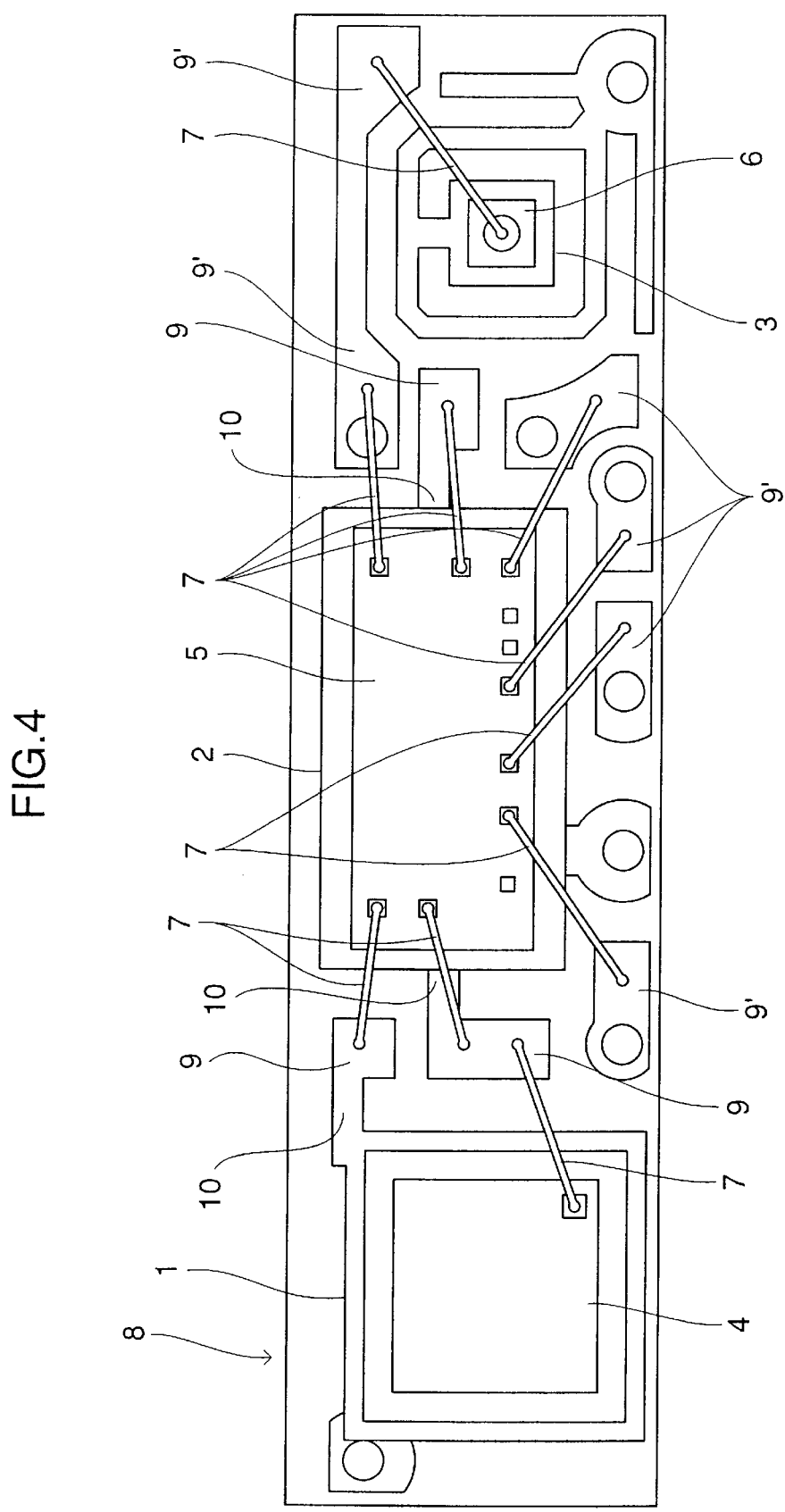

US 6,577,016 B2

SEMICONDUCTOR DEVICE HAVING ADHESIVE INFLOW PREVENTING MEANS

CROSS-REFERENCE TO RELATED APPLICATION

This application is related to Japanese Patent Application No. 2001-112346 filed in Apr. 11, 2001 whose priority is claimed under 35 USC §119 the disclosure of which is incorporated by reference in its entirety.

BACKGROUND OF THE INVENTION

1. Field of the Invention

The present invention relates to a semiconductor device such as, for example, an optical spatial transmitter that performs infrared ray data communication of IrDA (Infrared Data Association) or the like.

2. Description of the Prior Arts

Explained hereinbelow is an optical spatial transmitter having an infrared ray data communication technique of IrDA as a conventional semiconductor device.

The current IrDA standard includes IrDA 1.2 for low power in addition to IrDA 1.0 (transmission speed is 2.4 kbps to 115.2 kbps) and IrDA 1.1 (transmission speed is 9.6 kbps to 4 Mbps). An optical spatial transmitter designed based upon these IrDA standards is used for data communication between each personal computer or between a personal computer and peripheral devices with one-to-one half-duplex operation, or widely used for products such as PDA (Personal Digital (Data) Assistants: personal information terminal) or a cellular phone.

A surface-mounted optical spatial transmitter mounted to these devices will be explained with reference to FIG. 4.

FIG. 4 is a front view showing an essential part of a surface-mounted optical spatial transmitter. In FIG. 4, numeral 4 designates a light-receiving element such as a photodiode to which receiving data in the infrared ray data communication is inputted, 5 an integrated circuit element such as IC (Integrated Circuit) that performs various processings such as amplifying and digitizing the electrical signal from the light receiving element 4 and digitally outputting the same, 6 a light emitting element such as a light emitting diode that outputs transmit data in the infrared ray data communication, 8 a print wiring board, and 1, 2 and 3 respectively an element mounting section, each of which is disposed on the print wiring board 8 and on which the light receiving element 4, the integrated circuit element 5 and the light emitting element 6 are respectively fixed to be mounted with a conductive or insulating adhesive paste. The light receiving element 4, integrated circuit element 5 and light emitting element 6 are generally fixed by a conductive adhesive agent. Numeral 7 denotes a gold wire for wire-bonding each element 4, 5 and 6 to the wiring on the print wiring board 8 to connect each element to the wiring, 9 and 9' gold wire connecting sections (wire connecting sections) mounted on the print wiring board 8 for a connection of the gold wire 7, and 10 a wiring section mounted on the print wiring board 8 for connecting the element mounting sections 1 and 2 to each gold wire connecting section 9.

As shown in FIG. 4, the light receiving element 4, the integrated circuit element 5 and the light emitting element 6 are respectively fixed to be mounted with an adhesive on each element mounting section 1, 2 and 3 on the print wiring board 8. Each mounted element 4, 5 and 6 is wire-bonded to each metal wiring section 9 and 9' on the print wiring board 8 with the gold wire 7 to thereby complete the connection. Each metal wiring connecting section 9 is mounted on the same wiring section 10 as the element mounting sections 1 and 2. Specifically, the element mounting sections 1 and 2 are connected to each metal wiring section 9 by each wiring section 10. The metal wiring section 9' is connected to none of the element mounting sections 1, 2 and 3 via the wiring on the print wiring board 8.

The optical spatial transmitter having the above structure is required to have a miniaturized print wiring board 8 and respective miniaturized semiconductor elements mounted on the print wiring board 8 as a product has been downsized. In order to achieve the miniaturization, the surface area of the print wiring board 8 is made small for narrowing the space between the element mounting sections 1 and 2 and each gold wire connecting section 9, which requires to shorten the wiring section 10.

However, the above-mentioned conventional technique utilizes narrowing the space between the element mounting sections 1, 2 and the gold wire connecting section 9 for shortening the wiring section 10, whereby a paste-like adhesive or its component such as epoxy resin flown out upon manufacturing to be leaked out from the element mounting sections 1, 2 or run spread. The leaked adhesive or component streams down the wiring section 10 and reaches each gold wire connecting section 9.

This leaked adhesive or component causes a poor wire bonding including a state that the gold wire 7 cannot be connected to the gold wire connecting section 9, or a state that the connection intensity becomes weak so that the gold wire 7 is detached from the gold wire connecting section 9. Even though the gold wire 7 is not detached from and connected to the gold wire connecting section 9 upon manufacturing this optical spatial transmitter, a defect may occur such that the gold wire 7 is detached from the gold wire connecting section 9 due to heat stress caused by a reflow in the solder bonding that is applied for mounting the transmitter to the product.

As described above, there has been a problem that, as the optical spatial transmitter is miniaturized, the adhesive or its component is leaked out from the element mounting sections 1, 2 and flown into each gold wire connecting section 9, that leads to the aforementioned defects.

SUMMARY OF THE INVENTION

The present invention is accomplished to solve the aforementioned problem, and aims to provide a semiconductor device capable of being miniaturized by preventing the inflow of an adhesive or its component of the components composing the adhesive.

In order to solve the above-mentioned problem, the present invention provides a semiconductor device comprising an element mounting section, a wire connecting section and a wiring section for connecting the element mounting section and the wire connecting section, all of which are provided at least one by one on the same surface of a print wiring board, in which a semiconductor element is fixed to be mounted to the element mounting section with an adhesive and the semiconductor element is wire-bonded to be connected to the wire connecting section, wherein the wiring section is provided with inflow preventing means for preventing the inflow of the adhesive arranged at the element mounting section and the component composing the adhesive into the wire connecting section via the wiring section.

Providing the inflow preventing means at the wiring section that connects the element mounting section to the wire connecting section can prevent the inflow of the adhesive or its component into the wire connecting section. Therefore, the print wiring board can be miniaturized without considering the defect in wire bonding. This can miniaturize the semiconductor device itself.

Further, the present invention provides that, in the above-mentioned semiconductor device, wherein the wiring section includes a belt-like zone connecting the element mounting section with the wire connecting section, the inflow preventing means has a resist member provided on a belt-like zone of the wiring section.

According to the present invention, the resist member is applied or printed on the wiring section that connects the element mounting section to the wire connecting section, whereby the paste-like adhesive or its component is dammed up. Consequently, the inflow of the adhesive or the like into the wire connecting section can be prevented. Therefore, the print wiring board can be miniaturized without considering the defect in wire bonding. This can miniaturize the semiconductor device itself.

Moreover, the present invention provides that, in the above-mentioned semiconductor device, wherein the wiring section includes a belt-like zone connecting the element mounting section with the wire connecting section, and the inflow preventing means is formed of a portion of the belt-like zone which is narrower than other part thereof.

According to the present invention, the portion of the wiring section that is formed to be narrower hinders the paste-like adhesive or its component from flowing in, to thereby be capable of preventing the inflow of the adhesive or the like into the wire connecting section. Therefore, the print wiring board can be miniaturized without considering the defect in wire bonding. This can miniaturize the semiconductor device itself.

Additionally, the present invention provides that, in the above-mentioned semiconductor device, the inflow preventing means is formed such that a plurality of curved sections are formed at a portion of the wiring section.

According to the present invention, forming a plurality of curved sections at the wiring section can substantially lengthen the distance between the element mounting section and the wire connecting section compared to the case where this distance is linked with a straight line that is the shortest route. This can prevent the paste-like adhesive or its component from reaching the wire connecting section, to thereby be capable of preventing the inflow of the adhesive or the like into the wire connecting section. Consequently, the print wiring board can be miniaturized without considering the defect in wire bonding. This can miniaturize the semiconductor device itself.

Further, the present invention provides that, in the above-mentioned semiconductor device, at least two semiconductor elements are mounted on the same surface of the print wiring board, one of which is mounted to the element mounting section, wherein the wire connected to the other semiconductor element is bonded to the wire connecting section.

This structure can miniaturize the print wiring board used for the semiconductor device comprising at least two semiconductor elements, to thereby be capable of miniaturizing the semiconductor device itself.

Moreover, the present invention provides that, in the above-mentioned semiconductor device, a light emitting element, a light receiving element and an integrated circuit element are mounted on the same surface of the print wiring board for forming a spatial optical transmitter, wherein one of the semiconductor elements is the light receiving element while the other semiconductor element is the integrated circuit element.

This structure can miniaturize the print wiring board used for the optical spatial transmitter comprised of the light emitting element, light receiving element and the integrated circuit element, to thereby be capable of miniaturizing the semiconductor device itself.

BRIEF DESCRIPTION OF THE DRAWINGS

FIG. 4 is a front view showing an essential part of a conventional surface-mounted optical spatial transmitter.

DESCRIPTION OF THE PREFERRED EMBODIMENT

A few preferred embodiments of the present invention will be explained hereinbelow with reference to the drawings. The same numerals in the figures designate the same parts explained in the conventional technique.

Explained hereinbelow are embodiments 1 to 3 in which the present invention is applied for a surface-mounted optical spatial transmitter. However, the present invention can be applied for a device other than the surface-mounted optical spatial transmitter if the fixing section and the wire connecting section are mounted on the same wiring section.

Embodiment 1

The embodiment 1 of the present invention will be explained with reference to FIG. 1 that is a front view showing an essential part thereof.

Figure 1:
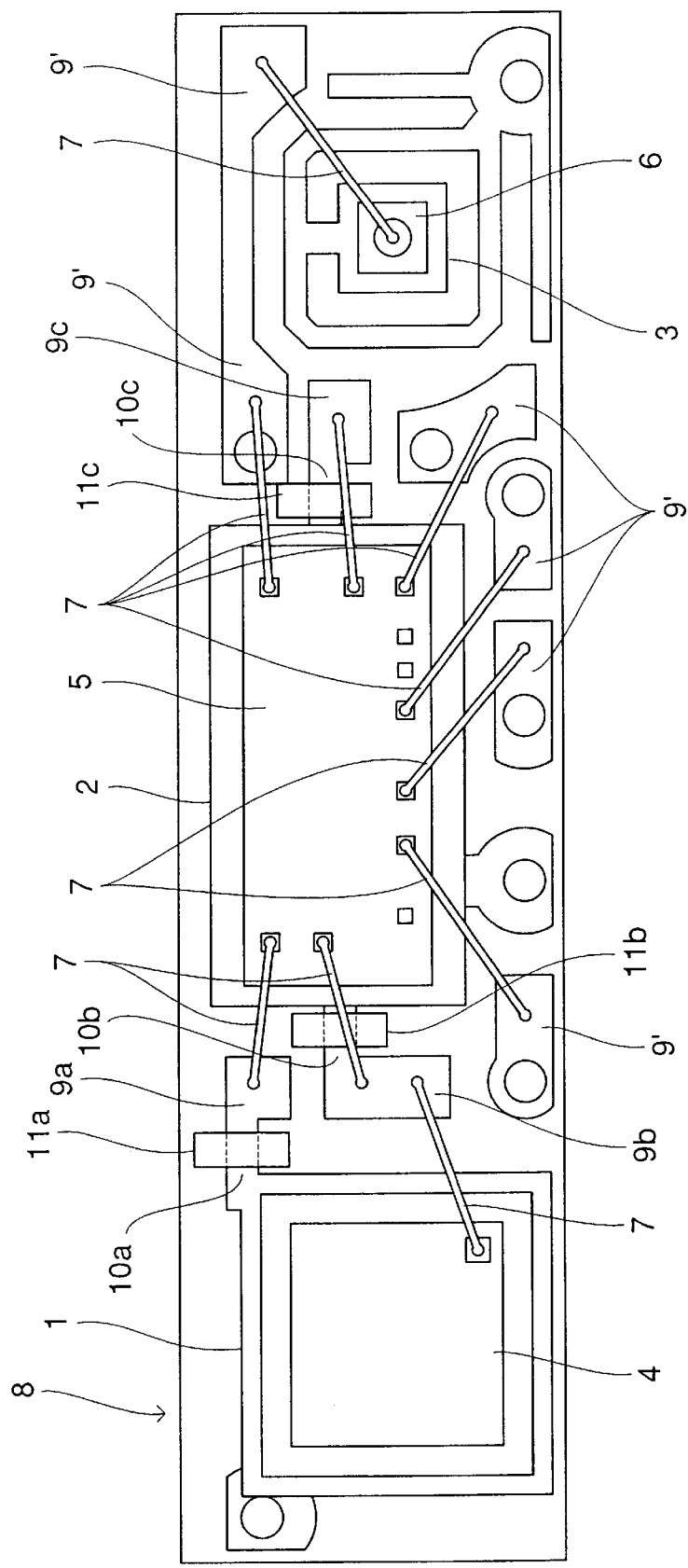
FIG. 1 is a front view showing an essential part of a surface-mounted optical spatial transmitter of an embodiment 1 according to the present invention.

In FIG. 1, numeral 4 designates a light-receiving element such as a photodiode to which receiving data in the infrared ray data communication is inputted, 5 an integrated circuit element such as IC that performs various processings such as amplifying and digitizing the electrical signal from the light receiving element 4 and digitally outputting the same, 6 a light emitting element such as a light emitting diode that outputs transmit data in the infrared ray data communication, 8 a print wiring board, and 1, 2 and 3 respectively an element mounting section, each of which is disposed on the print wiring board 8 and on which the light receiving element 4, the integrated circuit element 5 and the light emitting element 6 are respectively fixed to be mounted with a conductive or insulating adhesive paste. The light receiving element 4, integrated circuit element 5 and light emitting element 6 are generally fixed by a conductive adhesive agent. Numeral 7 denotes a gold wire for wire-bonding each element 4, 5 and 6 to the wiring on the print wiring board 8 to connect each element to the wiring, 9a to 9c and 9' gold wire connecting sections (wire connecting sections) mounted on the print wiring board 8 for a connection of the gold wire 7, 10a to 10c belt-like wiring sections mounted on the print wiring board 8 for connecting the element mounting sections 1 and 2 to each gold wire connecting section 9, and 11a to 11c resist members made of melanin resin or the like.

As shown in FIG. 1, the light receiving element 4, the integrated circuit element 5 and the light emitting element 6 are respectively fixed to be mounted with an adhesive on each element mounting section 1, 2 and 3 on the print wiring board 8. Each mounted element 4, 5 and 6 is wire-bonded to each gold wiring section 9a to 9c and 9' on the print wiring board 8 with the gold wire 7 to thereby complete the connection. The gold wiring connecting section 9a is mounted on the same wiring section 10a as the element mounting section 1, while the gold wire connecting sections 9b and 9c are mounted on the same wiring sections 10b and 10c as the element mounting section 2. Specifically, the element mounting section 1 is linked to the gold wiring section 9a by the wiring section 10a, while the element mounting section 2 is linked to the gold wire connecting sections 9b and 9c by the wiring sections 10b and 10c.

The gold wiring section 9' is linked to none of the element mounting sections 1, 2 and 3 via the wiring on the print wiring board 8.

In this embodiment, resist members 11a to 11c are formed on the belt-like wiring sections 10a to 10c by an application or printing.

Specifically, shown in this embodiment is a structure in which the light receiving element 4 is mounted to the mounting section 2 and the gold wire 7 connected to the integrated circuit element 5 is bonded to the gold wire connecting section 9a that is linked to the element mounting section 1 via the belt-like wiring section 10a, wherein the resist member 11a is formed on the belt-like wiring section 10a.

Further, the resist member 11b is formed on the belt-like wiring section 10b in the structure in which the integrated circuit element 5 is mounted to the element mounting section 2 and the gold wire 7 connected to the light receiving element 4 is bonded to the gold wire connecting section 9b that is linked to the element mounting section 2 via the belt-like wiring section 10b.

From a different point of view, the resist member 11b is formed on the belt-like wiring section 10b as described above in the structure in which the gold wire 7 connected to the integrated circuit element 5 mounted on the element mounting section 2 is bonded to the gold wire connecting section 9b that is linked to the element mounting section 2 via the belt-like wiring section 10b.

Further, the resist member 11c is formed on the belt-like wiring section 10c as described above in the structure in which the gold wire 7 connected to the integrated circuit element 5 mounted on the element mounting section 2 is bonded to the gold wire connecting section 9c that is linked to the element mounting section 2 via the belt-like wiring section 10c.

In the present embodiment, the paste-like adhesive or its component such as epoxy is dammed up by the resist members 11a to 11c as shown in the above. Consequently, the inflow of the adhesive or the like into the gold wire connecting sections 9a to 9c can be prevented. Therefore, the print wiring board can be miniaturized without considering the defect in wire bonding. This can miniaturize the optical spatial transmitter itself.

Although the shape of each resist members 11a to 11c is a rectangle in the figure, it is not limited to this. Specifically, each resist may have any shape if it has a sufficient height or width for damming up the adhesive or its component in order to prevent the adhesive or the like from streaming down the belt-like wiring sections 10a to 10c to be flown into the gold wiring connecting sections 9a to 9c. For example, it may have a shape of an ellipse or the like.

Embodiment 2

The embodiment 2, that relates to a surface-mounted optical spatial transmitter in which a portion of the wiring section is formed to be narrower than the other portions of the wiring section, will be explained with reference to FIG. 2 that is a front view showing an essential part thereof.

Figure 2:
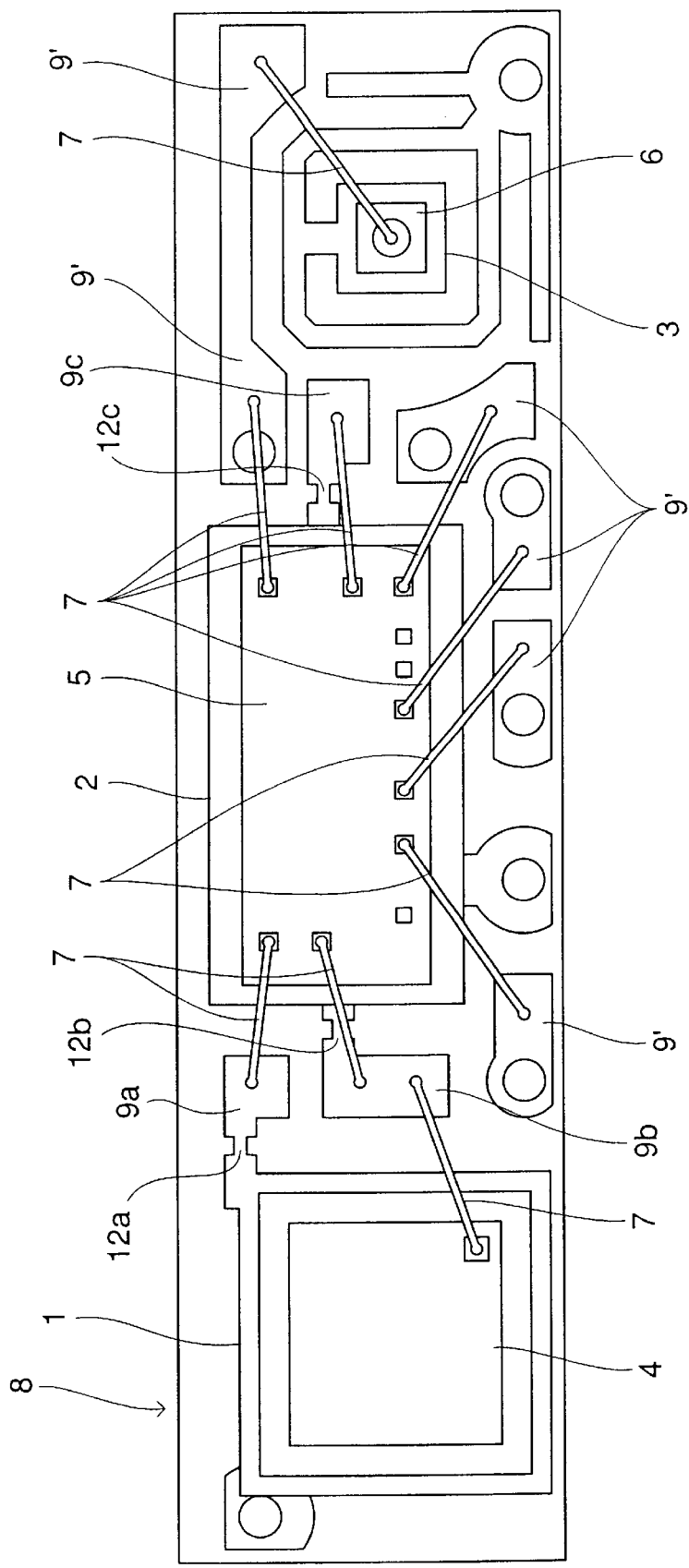
FIG. 2 is a front view showing an essential part of a surface-mounted optical spatial transmitter of an embodiment 2 according to the present invention.

The parts in FIG. 2 same as those in FIG. 1 showing the embodiment 1 are designated by the same numerals. Explanation will be made for the points different from the above-mentioned embodiment 1, and the explanation for the same points will be omitted.

In FIG. 2, numerals 12a to 12c designate belt-like wiring sections for linking the element mounting sections 1, 2 to the gold wire connecting sections 9a to 9c. A portion of each of the belt-like wiring sections is formed to be narrower than the other portions of each wiring section.

Specifically, shown in this embodiment is a structure in which the light receiving element 4 is mounted to the mounting section 1 and the gold wire 7 connected to the integrated circuit element 5 is bonded to the gold wire connecting section 9a that is linked to the element mounting section 1 via the wiring section 12a.

Further, this embodiment shows a structure that the integrated circuit element 5 is mounted to the element mounting section 2 and the gold wire 7 connected to the light receiving element 4 is bonded to the gold wire connecting section 9b that is linked to the element mounting section 2 via the belt-like wiring section 12b.

From a different point of view, the embodiment shows a structure that the gold wire 7 connected to the integrated circuit element 5 mounted on the element mounting section 2 is bonded to the gold wire connecting section 9b that is linked to the element mounting section 2 via the belt-like wiring section 12b.

Further, the embodiment shows a structure that the gold wire 7 connected to the integrated circuit element 5 mounted on the element mounting section 2 is bonded to the gold wire connecting section 9c that is linked to the element mounting section 2 via the belt-like wiring section 12c.

According to this embodiment, the portion of each belt-like wiring section 12a to 12c that is formed to be narrower hinders the paste-like adhesive or its component from flowing in, to thereby be capable of preventing the inflow of the adhesive or the like into the wire connecting sections 9a to 9c. Therefore, the print wiring board 8 can be miniaturized without considering the defect in wire bonding. This can miniaturize the optical spatial transmitter itself.

Embodiment 3

The embodiment 3, that relates to a surface-mounted optical spatial transmitter in which a plurality of curved sections are formed on a portion of the wiring section in the embodiments 1 and 2, will be explained with reference to FIG. 3 that is a front view showing an essential part thereof.

Figure 3:
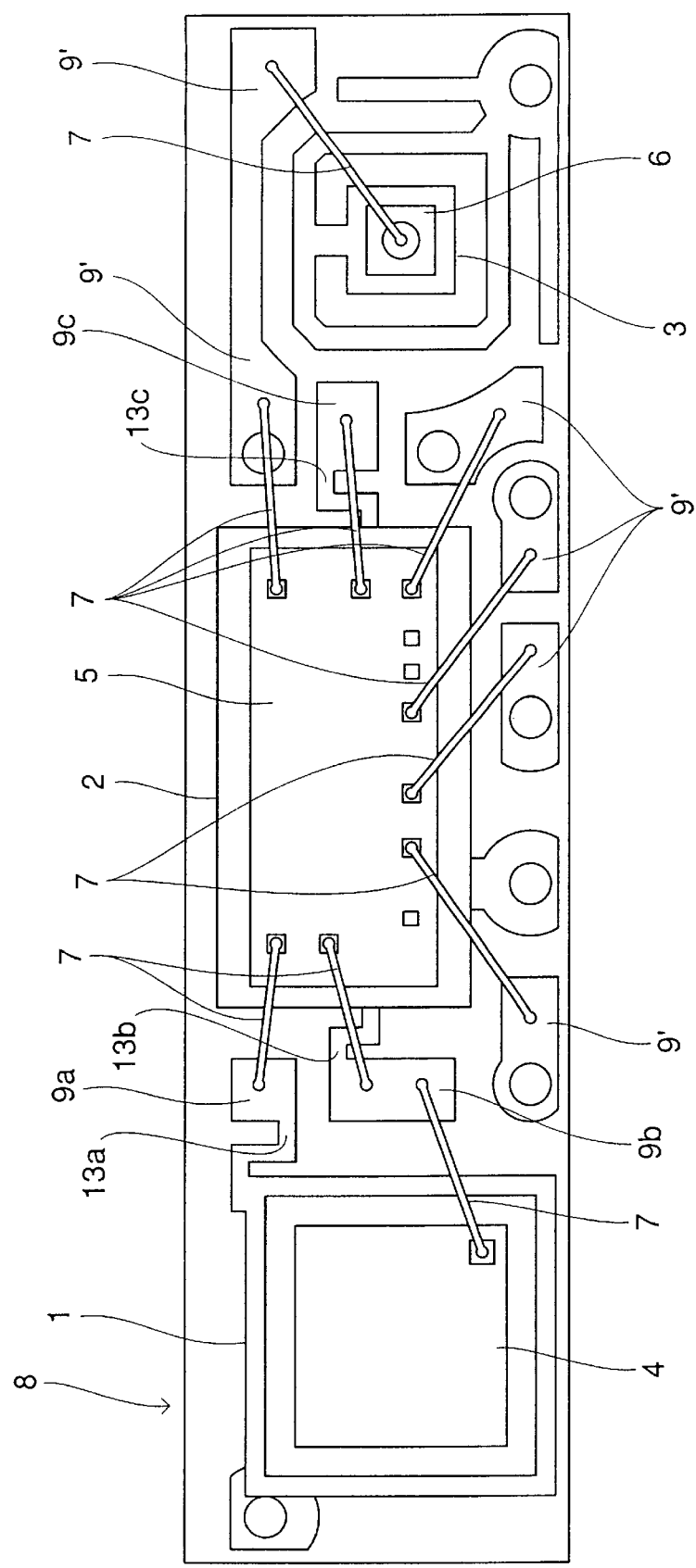
FIG. 3 is a front view showing an essential part of a surface-mounted optical spatial transmitter of an embodiment 3 according to the present invention.

The parts in FIG. 3 same as those in FIGS. 1 and 2 each showing the embodiment 1 or 2 are designated by the same numerals. Explanation will be made for the points different from the above-mentioned embodiments 1 and 2, and the explanation for the same points will be omitted.

In FIG. 3, numerals 13a to 13c designate wiring sections for linking the element mounting sections 1, 2 to the gold wire connecting sections 9a to 9c. Formed on each wiring section at two portions are curved sections each of which is curved at an angle of 90 degrees in the figure.

Specifically, shown in this embodiment is a structure in which the light receiving element 4 is mounted to the mounting section 1 and the gold wire 7 connected to the integrated circuit element 5 is bonded to the gold wire connecting section 9a that is linked to the element mounting section 1 via the wiring section 13a.

Further, this embodiment shows a structure that the integrated circuit element 5 is mounted to the element mounting section 2 and the gold wire 7 connected to the light receiving element 4 is bonded to the gold wire connecting section 9b that is linked to the element mounting section 2 via the wiring section 13b.

From a different point of view, the embodiment shows a structure that the gold wire 7 connected to the integrated circuit element 5 mounted on the element mounting section 2 is bonded to the gold wire connecting section 9b that is linked to the element mounting section 2 via the wiring section 13b.

Further, the embodiment shows a structure that the gold wire 7 connected to the integrated circuit element 5 mounted on the element mounting section 2 is bonded to the gold wire connecting section 9c that is linked to the element mounting section 2 via the wiring section 13c.

According to this embodiment, forming a plurality of curved sections at the wiring section can substantially lengthen the distance between the element mounting sections 1, 2 and the wire connecting sections 9a to 9c compared to the case where this distance is linked with a straight line that is the shortest route. This can prevent the paste-like adhesive or its component from reaching the wire connecting section, to thereby be capable of preventing the inflow of the adhesive or the like into the wire connecting sections 9a to 9c. Consequently, the print wiring board can be miniaturized without considering the defect in wire bonding. This can miniaturize the optical spatial transmitter itself.

Although the curved section is formed at two portions on each wiring section 13a to 13c in the figure, it is not limited to this. Specifically, the curved section may be formed in any number if it can lengthen the distance between the element mounting sections 1, 2 and the wire connecting sections 9a to 9c for preventing the paste-like adhesive or its component from flowing into the gold wire connecting sections 9a to 9c. For example, three or more curved sections may be formed.

According to the semiconductor device of the present invention, providing the inflow preventing means at the wiring section that connects the element mounting section to the wire connecting section can prevent the inflow of the adhesive or its component into the wire connecting section. Therefore, the print wiring board can be miniaturized without considering the defect in wire bonding. This can miniaturize the semiconductor device itself.

What is claimed is:

1. A semiconductor device comprising:

a print wiring board having an element mounting section, a wire connecting section and a wiring section for connecting the element mounting section with the wire connecting section, all of which are provided at least one by one on the same surface of the printing wiring board, wherein a semiconductor element is fixed to be mounted on the element mounting section with an adhesive, and is wire-bonded to the wire connecting section, and the wiring section is provided with inflow preventing means for preventing the adhesive or its component from flowing to the wire connecting section via the wiring section.

2. A semiconductor device claimed in claim 1, wherein the wiring section includes a belt-like zone connecting the element mounting section with the wire connecting section, and the inflow preventing means includes a resist member coated or printed across the belt-like zone.

3. A semiconductor device claimed in claim 1, wherein the wiring section includes a belt-like zone connecting the element mounting section with the wire connecting section, and the inflow preventing means is formed of a portion of the belt-like zone which is narrower than other part thereof.

4. A semiconductor device claimed in claim 1 or 3, wherein the inflow preventing means is formed such that a plurality of curved sections are formed at a portion of the wiring section.

5. A semiconductor device claimed in claims 1, wherein at least two semiconductor elements are mounted on the same surface of the print wiring board, one of which is mounted on the element mounting section, wherein the wire connected to the other semiconductor element is bonded to the wire connecting section.

6. A semiconductor device claimed in claim 5, wherein a light emitting element, a light receiving element and an integrated circuit element are mounted on the same surface of the print wiring board for forming a spatial optical transmitter, wherein one of the semiconductor elements is the light receiving element while the other semiconductor element is the integrated circuit element.

* * * * *